United States Patent [19]

Malaviya

[11] 4,131,861
[45] Dec. 26, 1978

[54] VARIABLE FREQUENCY OSCILLATOR SYSTEM INCLUDING TWO MATCHED OSCILLATORS CONTROLLED BY A PHASE LOCKED LOOP

[75] Inventor: Shashi D. Malaviya, Fishkill, N.Y.

[73] Assignee: International Business Machines Corporation, Armonk, N.Y.

[21] Appl. No.: 865,809

[22] Filed: Dec. 30, 1977

[51] Int. Cl.² .................. H03B 3/04; H03C 3/00; H03D 3/18
[52] U.S. Cl. ............................ 331/2; 325/184; 329/50; 329/122; 331/8; 331/10; 331/25; 331/108 D; 331/113 R; 332/14; 332/16 T; 332/19
[58] Field of Search ................. 331/2, 8, 10, 11, 12, 331/18, 23, 25; 329/50, 103, 122, 123, 124, 125; 332/14, 16T, 19; 325/63, 148, 184

[56] References Cited

U.S. PATENT DOCUMENTS

| 3,371,281 | 2/1968 | Powell | 329/122 X |
| 3,899,746 | 8/1975 | Gammel | 331/2 |

Primary Examiner—Siegfried H. Grimm
Attorney, Agent, or Firm—Theodore E. Galanthay

[57] ABSTRACT

Disclosed is a variable frequency oscillator system having a very stable center frequency and adjustable over a wide range of frequency excursions. A pair of variable frequency oscillators (VFO) are fabricated on the same integrated circuit chip so that corresponding components have substantially identical characteristics. The first VFO and a highly stable crystal oscillator provide comparable frequency output signals to a phase locked loop which provides as its output a correction signal (voltage or current) to lock the first VFO to the crystal oscillator frequency. The frequency of the second VFO in turn will be essentially the same as that of the first because of similarities in components and operating conditions as well as sharing of the correction signal between the two VFO's. The output of the second VFO provides the local clock signal and can be varied further by a second correction signal. In one embodiment, the second correction signal is provided by a second phase locked loop.

9 Claims, 5 Drawing Figures

VARIABLE FREQUENCY OSCILLATOR SYSTEM INCLUDING TWO MATCHED OSCILLATORS CONTROLLED BY A PHASE LOCKED LOOP

CROSS REFERENCE TO RELATED PATENTS AND PUBLICATIONS

1. Malaviya, U.S. Pat. No. 3,870,900 "Phase Discriminator Having Unlimited Capture Range" issued Mar. 11, 1975.
2. Malaviya, U.S. Pat. No. 3,899,753 "Controlled High Frequency Transistor Crystal Oscillator" issued Aug. 12, 1975.
3. Grebene, "The monolithic phase-locked loop — a versatile building block," IEEE Spectrum, (March, 1971), pp. 38–49.

BACKGROUND OF THE INVENTION

1. Field of the Invention

The present invention relates to a variable frequency oscillator system and more particularly to such an oscillator system having a highly stable center frequency output signal with the added flexibility of large excursions about the center frequency.

2. Description of the Prior Art

The prior art has extensively addressed the problem of sychronizing a number of independently operating systems. In the case of communication links, a master timing clock has the slave clocks at remote locations locked to the same frequency for data transmission. In the case of a number of data processing systems communicating with each other or peripheral units, synchronous operation is also desired. There is a known penalty for operating asynchronously which inevitably requires buffer systems that are expensive, and deteriorate system performance.

Synchronous operation, however, requires that the master and slave systems operate at identical frequencies when communicating with each other. Of course, each station must also have its own clock in order to operate independently when not communicating with another unit. All the clocks in the individual units are preferably crystal oscillators as these are the best known for obtaining a stable center frequency. Crystal oscillators have stable center frequencies to an accuracy of 1 cycle/$10^7$ cycles but their frequency is very difficult to vary about the stable center frequency.

On the other hand, variable frequency oscillators (VFO's) have a widely variable frequency range but lack center frequency stability. The best known VFO's have stability of only 1 cycle/$10^5$. Moreover, such relatively stable VFO's require very precisely constructed inductors and capacitors and other components usually incompatible with large scale integrated circuit (LSI) construction.

SUMMARY OF THE INVENTION

Accordingly, it is a primary object of my invention to fabricate a high excursion variable frequency oscillator having a highly stable center frequency;

It is another object of my invention to provide such an oscillator with ease and linearity of control;

Lastly, it is an object of my invention to fabricate an improved variable frequency oscillator suitable for fabrication in integrated circuit technology.

In accordance with my invention, a pair of identical oscillators are formed on the same integrated circuit chip. Since corresponding components are formed at the same time by the same semiconductor processes, the individual components and overall characteristics of the two oscillators will be nearly identical. Their component values are selected to provide a frequency output that is nominally near the output of a highly stable crystal oscillator. The output of the crystal oscillator and the output of one of the variable frequency oscillators are provided to a phase locked loop which provides a correction signal to both variable frequency oscillators. This causes the first VFO to lock in with the reference frequency so that its output frequency becomes identical with the reference frequency. This further causes the second variable frequency oscillator to have an output frequency that is highly stable about the center (reference) frequency of the crystal oscillator. The output of this second VFO can then be used as the system clock for the local system.

In order to provide a desired excursion about the stable center frequency, I provide a second control input to the second VFO only. The second control input can come from a second phase locked loop which receives as its two inputs the signal frequency from a remote master clock and the original output of the second VFO. In this manner, the local system clock is now operating in synchronism with the remote master clock and can quickly revert to the original stable frequency when the remote control is removed.

As an alternative, the circuit of my invention can be used in a frequency modulating mode. A large signal swing of relatively lower frequency than the frequency of the crystal oscillator is provided as the second correction input to the second VFO. This will cause the output of the second VFO to be a frequency modulated signal in which the base band information was the second correction signal to the second VFO. As a still further alternative, if the remote master clock provides a frequency modulated signal, then the output of the second phase locked loop which receives as its second input the output of the second VFO, will be a discriminated signal.

The foregoing and other object, features, and advantages of my invention will be apparent from the following and more particular description of the various preferred embodiments of the invention, as illustrated in the accompanying drawings.

DETAILED DESCRIPTION OF THE DRAWINGS

Figure 1:
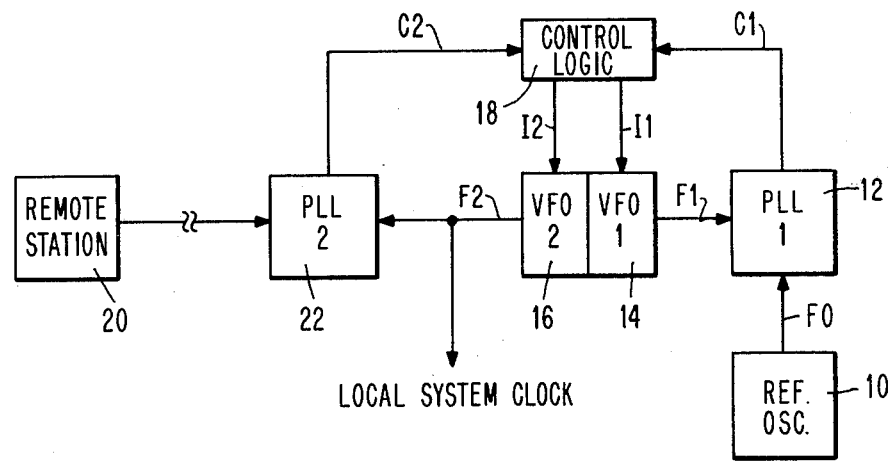
FIG. 1 is a block diagram of one embodiment of my invention.

Refer now to FIG. 1 which is a block diagram of one embodiment of my invention. Illustrated is a variable frequency oscillator with a highly stable center frequency. The desired center frequency (F0) is provided by reference oscillator 10. Highly stable reference oscillators are usually crystal controlled. Crystal controlled oscillators in the class of circuits using piezo-electric devices are well known in the art and customarily used for the purpose of generating a stable series of pulses.

An example of such a high frequency transistor crystal oscillator suitable for large scale integration is described in my above referenced U.S. Pat. No. 3,899,753.

This highly stable center frequency (F0) is supplied as a first input to a first phase locked loop (PLL) 12. Phase locked loop 12 receives a second input from a first variable frequency oscillator (VFO) 14. VFO 14 is designed to have a nominal frequency output (F1) which is approximately equal to the center frequency (F0). An inevitable initial difference in frequencies (F0 and F1) will result in a first correction signal output (C1) to emanate from phase locked loop 12 and be provided as an input to both the first VFO 14 as well as a second VFO 16 via control logic 18. Soon the correction signal makes F1 equal to F0 (locked-in state).

In accordance with the present invention, VFO 14 and VF0 16 are constructed on the same integrated circuit substrate so that they are essentially twins. This means that corresponding circuit components are formed simultaneously in accordance with well known integrated circuit fabrication techniques. The end result is that the characteristics of the two VFO's are substantially identical. Moreover, the physical proximity of the two VFO's on a semiconductor chip will cause them to track during variations in temperature as well as power supply potentials, etc. This unique concept of having a pair of perfectly matched variable frequency oscillators permits the output of the second VFO 16 to be at a frequency F2 which is substantially identical to the frequency F1 which in turn is identical to the center frequency F0. For this reason, the output of VFO 16, frequency F2, is a suitable reference waveform for the local system clock. Thus, any local system whether a communication system or an arithmetic processing unit, can operate under the control of the output of VFO 16 in the same manner as it would under the control of reference oscillator 10.

Assume now that a remote station 20 wishes to communicate with the local system. Such a remote station 20 would typically be equipped with a reference oscillator corresponding to the reference oscillator 10 in the local system and also operating under the control of a crystal having an output frequency nearly identical to the one in reference oscillator 10. It is well known, however, that absolutely exact matches of phase and frequency between the reference oscillator at the station 20 and reference oscillator 10 are not possible. Accordingly, a signal received from remote station 20 into the second phase locked loop 22 in the local system will not be in synchronism with frequency (F2). The difference will cause phase locked loop 22 to provide a second correction signal C2 to the second VFO 16 only via control logic 18. Thus, VFO 16 will provide a modified signal frequency (F2) locking the local system clock to the frequency provided by the signal from remote station 20.

Figure 2:
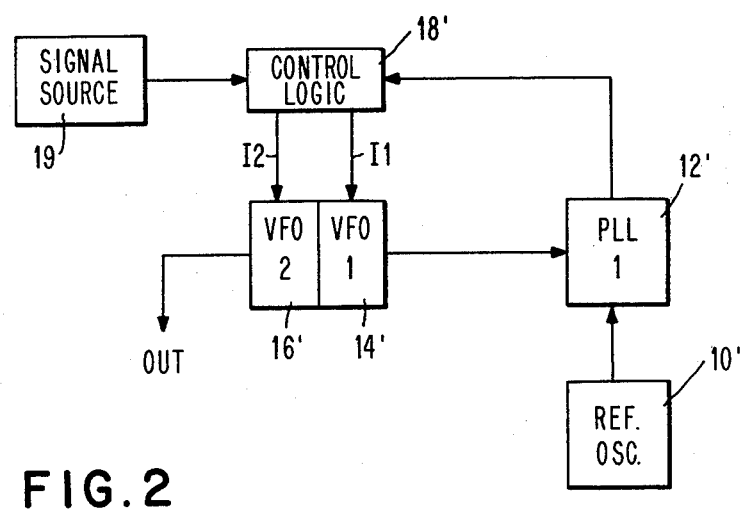
FIG. 2 is a block diagram of an alternate embodiment of my invention.

Refer now to FIG. 2 which is an alternate embodiment of my present invention. Structurally, the FIG. 2 embodiment is a subcombination of the FIG. 1 configuration. For this reason, corresponding elements have been identified with corresponding reference numerals having a prime notation. Reference oscillator 10' provides a stable center frequency output to first phase locked loop 12'. A second input to phase locked loop 12' is provided by first VFO 14'. The output of phase locked loop 12' is a correction signal supplied to both first VFO 14' and second VFO 16' via control logic 18'. The output of first VFO 14' will soon be locked to become identical to the frequency of reference oscillator 10'. At this point the distinctions between the embodiments of FIG. 1 and FIG. 2 will become more apparent. The input signal supplied by signal source 19, via control logic 18', to the second VFO 16' only, is selected as a large signal having a frequency significantly less than the center frequency output of reference oscillator 10'. The output of VFO 16' will thus be a frequency modulated signal at the output terminal having both base band and carrier components. The base band information will include the signal provided by signal source 19 while the carrier frequency will be at the center frequency provided by reference oscillator 10'.

Furthermore, it will be noted that the embodiment of FIG. 1 can be used as a discriminator. Assuming that remote station 20 provides a frequency modulated signal (as for example the output of VFO 16; in FIG. 2) to phase locked loop 22, then the correction signal C2 will be the base band information (as for example the previously described signal provided by signal source 19 in FIG. 2).

Figure 3:
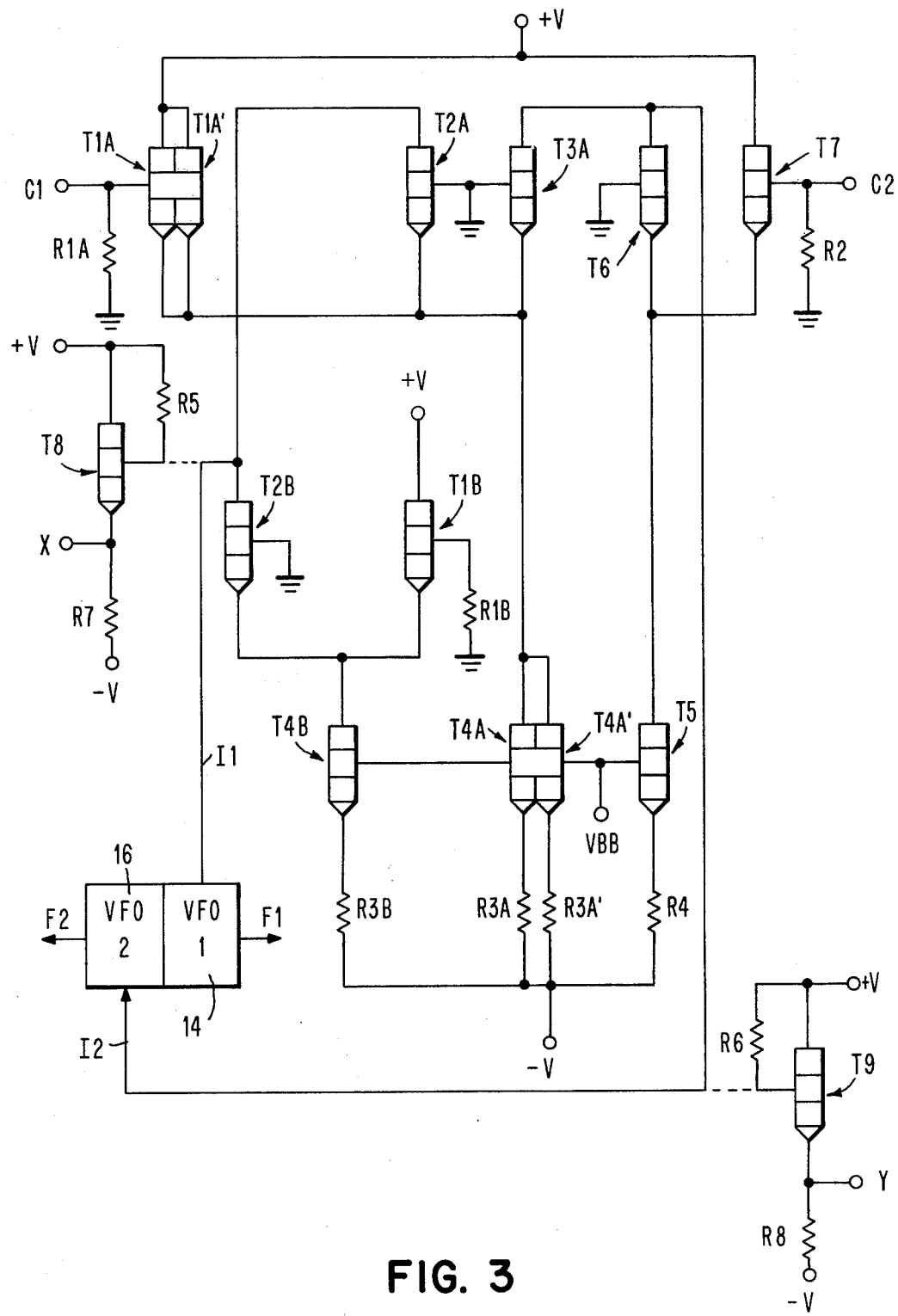
FIG. 3 is a circuit diagram of the control logic of my invention.

Refer now to the circuit diagram of FIG. 3 for a description of control logic 18. Those skilled in the art will recognize that this is an exemplary arrangement for providing the control current I1 based on the correction signal C1 to VFO 14 and control current I2 based on correction signals C1 and C2 to VFO 16. Correction signal C1 is received at the bases of transistors T1A and T1A' which form a modified current switch circuit with transistors T2A and T3A. The bases of T1A and T1A' are terminated to ground potential via resistor R1A. Transistors T1A, T1A', T2A and T3A have their emitters connected in common to the collectors of transistors T4A and T4A' which, together with resistors R3A and R3A' form a current source. A second current switch consisting of T1B, T2B, T4B and R3B is also included in the circuit. The input of the second current switch remains permanently grounded via its input terminator resistor R1B. The collectors of transistors T2A and T2B are connected together to provide the correction signal I1. Assuming that the correction signal C1 traverses ground potential, the bases of T2A, T2B and T3A are connected to ground potential. The collectors of transistors T1A, T1A', T1B, and T7 are connected to +V.

A third identical current switch consisting of transistors T5, T6, T7, R2 and R4 is used for receiving the second control signal C2 at the base of T7. The collectors of transistors T3A and T6 are connected together to provide the control current I2. Correction signal C2 is received at the base of transistor T7 which forms a current switch circuit with transistor T6. The base of transistor T6 is connected to ground potential. Transistors T6 and T7 have their emitters connected in common to the collector of T5. The emitter of T5 is connected to −V volts via resistor R4 while the bases of T4A, T4A', T4B and T5 are connected to VBB. The emitters of T4A, T4A' and T4B are returned to −V via R3A, R3A' and R3B respectively. VBB is a base bias supply normally at least one base-to-emitter voltage drop below ground potential to avoid saturation in transistors T4A, T4A', T4B, and T5. It is highly desirable to make all the transistors identical and also to make resistors R3A, R3A', R3B and R4 identical. Preferably, terminator resistors R1A, R1B and R2 should also be identical.

So long as there is no correction signal C2, control currents I1 and I2 will be almost equal, making the frequency F2 of VFO 14 almost equal to the frequency of the reference oscillator 10. Control signal C2 will however be able to increase or decrease the current I2, and as such, vary the frequency of VFO 16 as desired.

Figure 4:
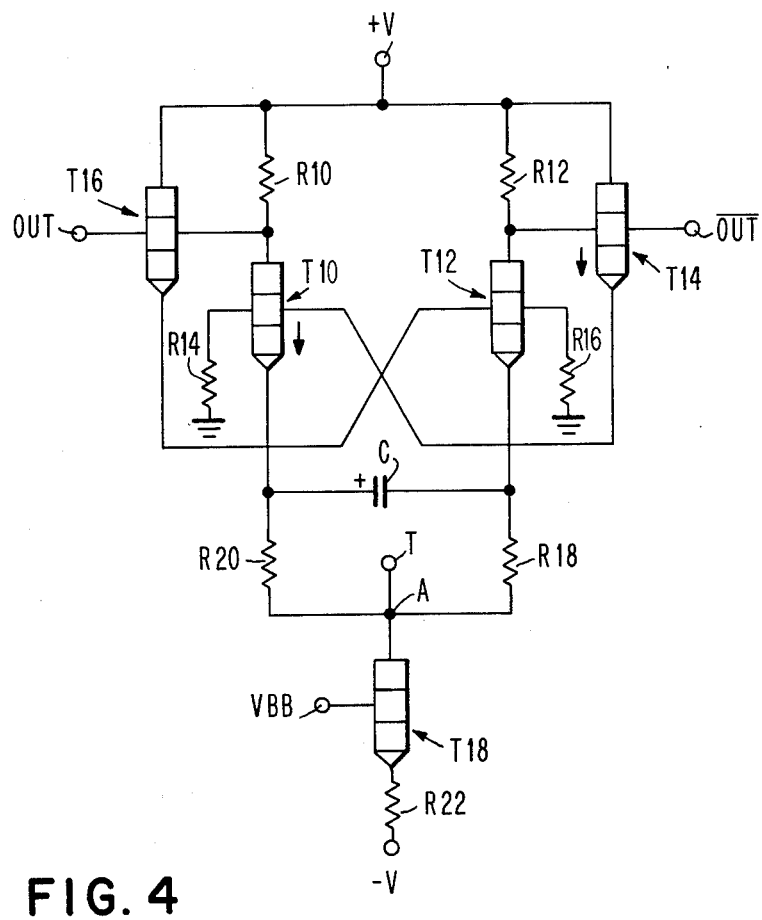
FIG. 4 is a circuit diagram of a variable frequency oscillator suitable for use with my invention.

Refer now to FIG. 4 for a circuit diagram of a variable frequency oscillator. Those skilled in the art will recognize this as an exemplary circuit and will find that other variable frequency oscillator circuits are also suitable to perform the function of the matched VFO's of my invention. Transistors T10 and T12 are a cross coupled pair. The base of transistor T10 is connected to the collector of T12 via the base to emitter path of the emitter follower transistor T14. Similarly, the base of T12 is connected to the collector of T10 via the base to emitter path of the emitter follower transistor T16. The base of transistor T10 is connected to ground potential by means of resistor R14 while the base of transistor T12 is connected to ground potential by resistor R16. The collector of transistor T14 and the collector of transistor T16 are connected to the potential +V. The collector of transistor T10 is connected to the potential +V via resistor R10. Similarly, the collector of T12 is connected to the potential +V via resistor R12. The oscillator outputs of opposite phase are provided at the collector of T10 and the collector of T12. It is noted that these are the same circuit points as the bases of T16 and T14 respectively. Outputs are also available at the emitters of T14 and T16. The in phase and out of phase outputs are arbitrary, and only one of them is needed in my present invention.

Resistor R18 connects the emitter of transistor T12 to terminal T and the collector of transistor T18. Resistor R20 connects the emitter of transistor T10 to terminal T and the collector of T18. Capacitor C capacitively couples the emitter of T10 and the emitter of T12. The emitter of T18 is connected to a suitable negative potential −V by means of resistor R22. The output frequency of this illustrated variable frequency oscillator is primarily determined by the value of capacitor C and the total current flowing out of node A through transistor T18 and/or terminal T. Terminal T receives either the control current I1 or I2 from the control circuit 18 shown in FIG. 3. Thus, when the circuit of FIG. 4 is the first VFO 14, then the input terminal T is connected to the collectors of T2A and T2B in FIG. 3. In the case where the circuit of FIG. 4 is the second VFO 16, then the input terminal T is connected to the collectors of transistors T3A and T6 in FIG. 3.

The just described example uses currents I1 and I2 as the control signals. Those skilled in the art will be able to see that VFO frequency variation is possible by using voltages as the control signals. In order to control a VFO with a voltage signal, additional circuit including transistors T8 and T9, as well as resistors R5, R6, R7 and R8 are provided in the control circuit as shown in FIG. 3. The two output currents I1 and I2 are now fed to two identical load resistors R5 and R6 whose other ends are tied to the +V supply. Outputs across R5 and R6 will preferably be buffered with identical emitter followers T8 and T9, with their emitters returned to −V via R7 and R8 respectively, before being fed to the output terminals X and Y respectively. One of these output terminals is connected to the base of T18 (FIG. 4) in order to control the current in the current source of the VFO illustrated in FIG. 4. Thus, by replacing VBB with a control voltage, T18 (with resistor R22) becomes a variable current source drawing current from node A.

Although the capacitance C is fixed, the current out of node A is variable permitting the oscillator of FIG. 4 to be a variable frequency oscillator. The fixed capacitor C can be integrated into the integrated circuit substrate or it can be externally connected to the substrate package. Both types of capacitors are frequently used in the integrated circuit art, depending on specific design requirements. In the present example, the frequency is varied by a changing current at the input terminal T of T18 causing the current flowing out of node A to vary. A wide range of frequency is easily obtained. The resistor R22 along with resistors R3A, R3A', R3B and R4 of FIG. 3 determine the limits of the variable frequency oscillator circuit.

Figure 5:
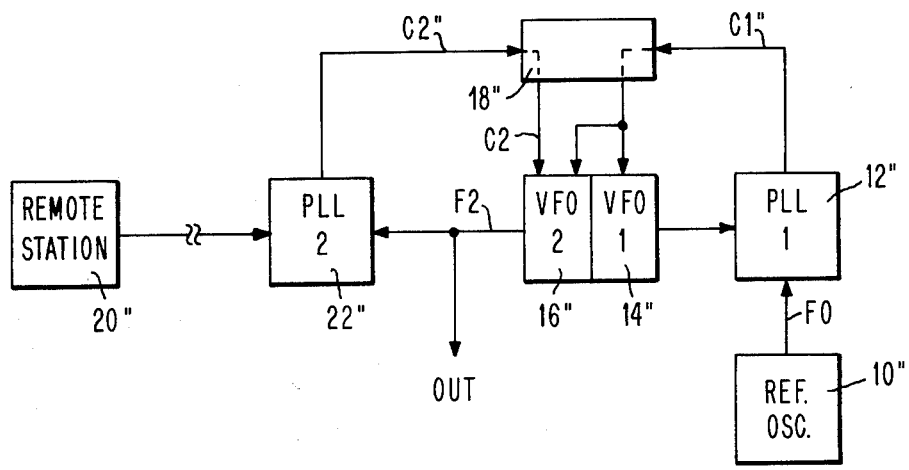
FIG. 5 is a still further embodiment of my invention

FIG. 5 describes a structural arrangement substantially identical to that described in FIG. 1 and the corresponding elements have been labeled with corresponding reference numerals having a double prime notation. It will be noted that control logic 18″ has essentially been eliminated. The correction signal C1″ is illustrated as being applied to both VFO 14″ and VF0 16″ while the correction signal C2″ is applied only to the VFO 16″. The reason for showing control logic 18″ at all is to provide whatever level shifting and/or impedance matching functions that might be desired. Otherwise, the correction signal C1″ is applied to both variable frequency oscillators at the VBB terminal of FIG. 4. Additionally, when the remote station transmits a signal, the correction signal C2″ is applied at terminal T. In this manner, VFO 16″ can be locked to the frequency of the remote station 20″.

For the various phase locked loops (PLL) utilized in conjunction with my present invention, numerous phase locked loops are known and readily available. Phase locked loops generally have the characteristic of accepting a pair of different frequencies at a pair of inputs and providing a correction signal (voltage or current) based on the difference in phase and/or frequency between the two input signals. An example of such a phase locked loop is found in my above referenced U.S. Pat. No. 3,870,900. Those desiring further detail should refer to the teachings in that patent which are hereby incorporated by reference. (Referring particularly to FIG. 2 of U.S. Pat. No. 3,870,900, the reference source 2 therein corresponds to reference oscillator 10 in the present application. Also, VFO source 4 in the patent corresponds to either of the variable frequency oscillators such as VFO 14 or 16 in the present application. The output may be taken from either terminal F, terminal G, or differentially from both as the correcting signal identified for example as C1 emanating from phase locked loop 12 in FIG. 1 of my present application. Suitable D.C. voltage level adjustments that may be required are well known.) As another example of a suitable phase locked loop, the Grebene article referenced above is also incorporated herein.

OPERATION

Referring now to all the drawings in general and particularly to FIGS. 1, 3 and 4, the operation of my invention will be described. Those skilled in the art will recognize the operation of my present invention as being quite straight-forward once the structural arrangement has been disclosed. By way of specific example, however, consider a reference oscillator 10 in FIG. 1 having a frequency of 10 megacycles. A crystal oscillator can be made to oscillate at this frequency and it is known to generate harmonics which can be used if even higher frequencies are desired. A crystal oscillator will generate a frequency such as 10 megacycles with a stability to at least three decimal places. Beyond that, however, variations in frequency will result.

VFO 14 is designed to have a nominal frequency output F1 also nominally 10 megacycles. Phase locked loop 12 detects the difference between the two frequencies and provides a resulting correction signal C1 at its output. This changes the control currents I1 and I2. In the case where F1 is at a higher frequency than F0, the correcting signal C1 will be positive. This will tend to turn on transistor T1A harder tending to cause transistors T2A and T3A to conduct less current. When transistor T2A conducts less current, the control current I1 becomes less. It is noted that the output frequency of the oscillator in FIG. 4 is inversely proportional to the value of capacitor C while it is directly proportional to the current drawn from node A. A decreased current through terminal T will tend to reduce the output frequency. On the other hand, if the output frequency F1 had been too low, phase locked loop 12 would have provided a negative voltage output, ultimately increasing the current through terminal T, permitting the frequency of the oscillator to increase.

Since current in transistor T3A is controlled at the same time as transistor T2A, the input current to VFO 16 is lowered simultaneously thereby decreasing the frequency of VFO 16 in the same manner as the frequency of VFO 14 was decreased. Similarly, as the frequency of first VFO 14 is increased, the frequency of second VFO 16 is also increased.

Accordingly, the output signal F2 from the second VFO 16 will provide the local system clock signal and be very close in frequency to the output frequency of the first VFO 14 which has a frequency F1 that is identical to the frequency of signal F0 which is the output of reference oscillator 10. This close relationship between the frequency of F1 and F2 (and therefore F2 and F0) persists until a second correction signal C2 is applied to the base of transistor T7. Such a correction signal C2 is typically generated in phase locked loop 22 in the same manner as described for phase locked loop 12, in response to a difference in frequency between F2 and the signal from remote station 20.

Assuming that remote station 20 is operating at a frequency lower than F2 then the second phase locked loop 22 provides a correction signal C2 which has a positive potential. This causes transistor T6 to conduct less current while transistor T7 will conduct more current tending to turn transistor T6 off. This tends to reduce the control current I2 in the second VFO 16, thereby lowering the frequency of second VFO 16. Thus, F2 which is still the local system clock is locked to the frequency of the signal received from remote station 20.

Refer now to FIG. 4 for a description of the oscillator which may be used with my invention. This is a basic astable circuit. Note that the output terminals of the circuit are at the collector of T10 and the collector of T12 or at their bases. Arbitrarily, the output at collector T10 has been designated the true output while the output at collector T12 has been designated the out of phase output. Either one of these outputs is suitable as the output to the phase locked loop. Assuming initially, that the true output at the collector of T10 is at a down level, then transistor T10 must be on and the node joining the capacitor C to resistor R20 must be at an up level. Also, the out of phase output must be at an up level causing transistor T14 to be on and providing the base drive for transistor T10 to be on. However, as capacitor C is gradually charging up, the current through it decreases causing the emitter of T12 to go more negative. The cycle is reversed when the charging rate is too low.

The result is a standard and well known type of oscillator. The smaller the value of capacitor C, the higher will be the frequency of oscillation. Increasing the current flowing from node A will further increase the frequency of operation. One method of increasing the current flow from node A is by means of terminal T, as has been described with respect to the circuits of FIG. 1 and FIG. 3. As an alternative, the base of T18 (FIG. 4), instead of being connected to VBB, is connected to either terminal X or Y in FIG. 3. This connection can be made through a suitable level shifter, if desired.

Referring now to FIG. 5 and with continued reference to FIG. 4, the correction signal C1″ is applied to the input terminal at the base of transistor T18 to both the first VFO 14″ and the second VFO 16″. In the present example, terminal X at the emitter of transistor T8 will be connected to the first VFO and the same line will be extended to also make a connection to the second VFO.

The second correction signal C2″ being connected to terminal T in FIG. 4 should have a signal level consistent with the fact that it is connected to the collector of T18 rather than the base. A suitable signal level could be derived, for example, by eliminating T9, R6 and R8 from FIG. 3 so that the C2″ signal to be connected to terminal T would be derived from the collector output of T6 and T3A. Such circuit details and numerous variations thereof are available to those skilled in the art. It is well known to regulate variable frequency oscillators with changes in voltage and/or current. In this particular case, the oscillator of FIG. 4 can have its frequency varied both by an input at the base of transistor T18 and by a second input at terminal T to further regulate the total current emanating from node A. As was previously mentioned, drawing an increasing amount of current from node A increases the frequency of oscillations. If there is no signal from remote station 20″, the second phase locked loop 22″ does not provide signals for altering current flow at terminal T.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A variable frequency oscillator system with highly stable center frequency output signal comprising;
   a stable reference frequency generating element providing a highly stable reference frequency output signal to a first phase locked loop;
   first and second variable frequency oscillators having substantially matched characteristics, said first variable frequency oscillator providing a second input to said first phase locked loop;
   input means for providing a control signal to said second variable frequency oscillator;
   said first phase locked loop providing a correction signal to both said first and second variable frequency oscillators whereby said second variable frequency oscillator provides a highly stable output signal at a frequency closely approximating said reference frequency and variable in accordance with the input signal provided by said input means.

2. A variable frequency oscillator system as in claim 1 wherein said reference frequency generating element is a crystal oscillator.

3. A variable frequency oscillator system as in claim 1 wherein said first and second variable frequency oscillators are fabricated on the same integrated circuit chip.

4. A variable frequency oscillator system as in claim 1 wherein said input means comprises:
a second phase locked loop;
a first input to said second phase locked loop being provided by the output of said second variable frequency oscillator;
a second input to said second phase locked loop being provided by an external source;
said second phase locked loop providing a second correction signal to said second variable frequency oscillator, thereby altering the output signal of the second variable frequency oscillator is accordance with the second input to said second phase locked loop.

5. A variable frequency oscillator system as in claim 4 further comprising:
an interfacing means connected between said first and second phase locked loops and said first and second variable frequency oscillators.

6. A plurlaity of electronic systems comprising:
a remote station operating at a desired master control frequency;
a local station operating at a desired frequency near the frequency of said remote master control frequency;
said local station having a variable frequency oscillator system as in claim 1; and
said remote station providing a signal to said input means.

7. A plurality of electronic systems comprising:
a remote station operating at a desired master control frequency;
a local station operating at a desired frequency near the frequency of said remote master control frequency;
said local station having a variable frequency oscillator system as in claim 4, said remote station being said external source.

8. A plurality of electronic systems as in claim 7 wherein:
said remote station provides as its output a frequency modulated signal to said second phase locked loop, said second phase locked loop providing as its output a discriminated base band signal.

9. A variable frequency oscillator system as in claim 1 wherein:
said input means provides a base band signal having a frequency substantially less than said reference frequency;
said second variable frequency oscillator providing an output signal that is frequency modulated having the output of said input means as the base band information which modulates the reference frequency provided by said reference frequency generating element.

* * * * *